United States Patent [19]
Fukase

[11] Patent Number: 6,133,115
[45] Date of Patent: Oct. 17, 2000

[54] FORMATION OF GATE ELECTRODE

[75] Inventor: Tadashi Fukase, Tokyo, Japan

[73] Assignee: NEC Corporation, Tokyo, Japan

[21] Appl. No.: 09/292,020

[22] Filed: Apr. 15, 1999

Related U.S. Application Data

[62] Division of application No. 08/692,278, Aug. 5, 1996, abandoned.

[30] Foreign Application Priority Data

Aug. 16, 1995 [JP] Japan .................................... 7-208690

[51] Int. Cl.$^7$ ...................................................... H01L 21/76
[52] U.S. Cl. .......................... 438/430; 438/439; 438/452; 438/592
[58] Field of Search ..................... 438/592, 207, 438/353, 620, 405, 410, 599, 600, 769, 770, 430, 439, 452, 225, 297, 164, 165; 257/306, 369, 311, 324

[56] References Cited

U.S. PATENT DOCUMENTS

| | | | |
|---|---|---|---|
| 4,671,851 | 6/1987 | Beyer et al. | 438/207 |
| 4,800,171 | 1/1989 | Iranmanesh et al. | 438/207 |
| 4,868,135 | 9/1989 | Ogura et al. | 438/207 |
| 4,950,616 | 8/1990 | Kahng et al. | 438/405 |
| 5,001,074 | 3/1991 | Arnborg | 438/207 |
| 5,134,085 | 7/1992 | Gilgen et al. | 438/620 |
| 5,258,096 | 11/1993 | Sandu et al. | 438/620 |
| 5,261,998 | 11/1993 | Kanetake et al. | 438/9 |
| 5,346,587 | 9/1994 | Doan et al. | . |
| 5,405,790 | 4/1995 | Rahim et al. | . |
| 5,441,902 | 8/1995 | Hsieh et al. | . |
| 5,494,842 | 2/1996 | Azmanov | . |
| 5,777,358 | 7/1998 | Yajima | . |

OTHER PUBLICATIONS

Y. Kawamoto et al., "A Half Micron Technology for an Experimental 16 Mbit DRAM Using i–Line Stepper," '88 VL Symp., pp. 17–18.

*Primary Examiner*—Mary Wilczewski
*Assistant Examiner*—Yung A. Lin
*Attorney, Agent, or Firm*—Sughrue, Mion, Zinn, Macpeak & Seas, PLLC

[57] ABSTRACT

The invention relates to an improvement in formation of a gate electrode. In the invention, there are formed first and second oxides on a surface of a substrate. The second oxides have a top surface higher by a height H than top surfaces of the first oxides. A gate electrode composed of a polysilicon film and a silicide film deposited on the polysilicon film is formed so that the polysilicon film is planarized at a level higher than top surfaces of the first oxides but lower than top surfaces of the second oxides. The invention prevents excessive etching of the polysilicon film without fabrication steps being increased, and thus makes it possible to form a gate electrode having a dimension defined by a mask.

14 Claims, 7 Drawing Sheets

FORMATION OF GATE ELECTRODE

This is a divisional of application Ser. No. 08/692,278 filed Aug. 5, 1996, now abandoned, the disclosure of which is incorporated herein by reference.

BACKGROUND OF THE INVENTION

1. Field of the Invention

The invention relates to a semiconductor device and a method of fabricating the same, and more particularly to an improvement in formation of a gate electrode of a semiconductor device.

2. Description of the Related Art

A currently available semiconductor device including a MOS transistor has oxides for isolating device formation regions from one another, formed by thermally oxidizing selected regions, and a polycide gate electrode having a two-layers structure including a polysilicon film and a silicide film, made of, for example, tungsten silicide, deposited on the polysilicon film.

Among such semiconductor devices, a 256 Mb DRAM having a micro-ordered structure and high integration includes device isolation regions having a width of 0.25 $\mu$m, device formation regions having a width of 0.25 $\mu$m, oxide films for device isolation having a thickness of 0.3 $\mu$m, and a gate electrode having a width of 0.25 $\mu$m. In order to form such micrometer-sized patterns, there is used lithography technique in which a short wavelength light such as KrF excimer laser is used as a light source.

Figure 1A:
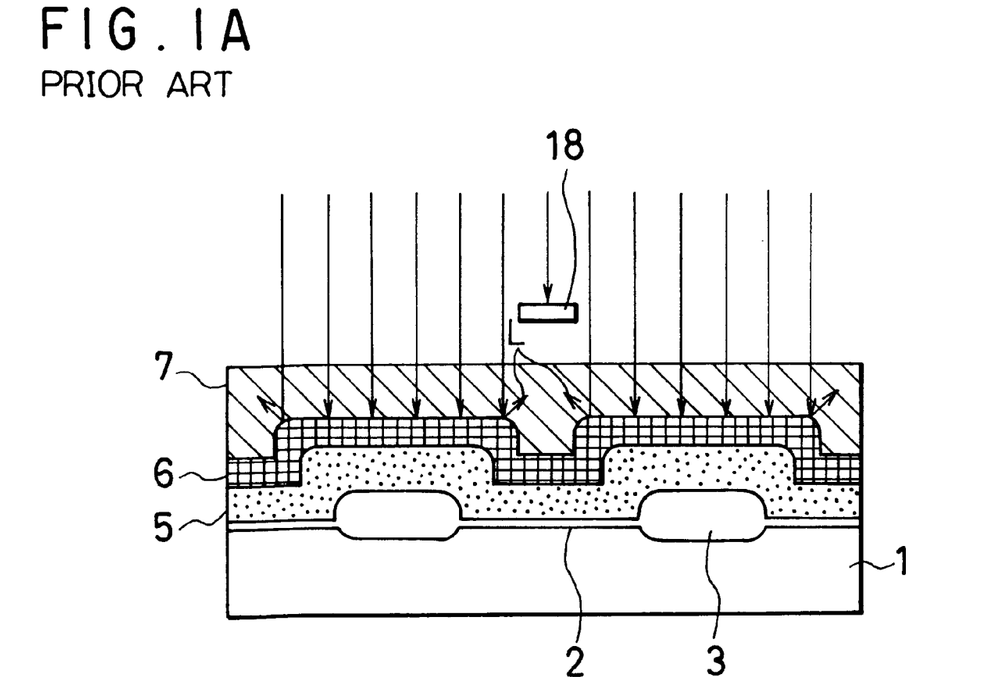
FIG. 1A is a cross-sectional view of a semiconductor device to be fabricated in accordance with a conventional method.
Figure 1B:
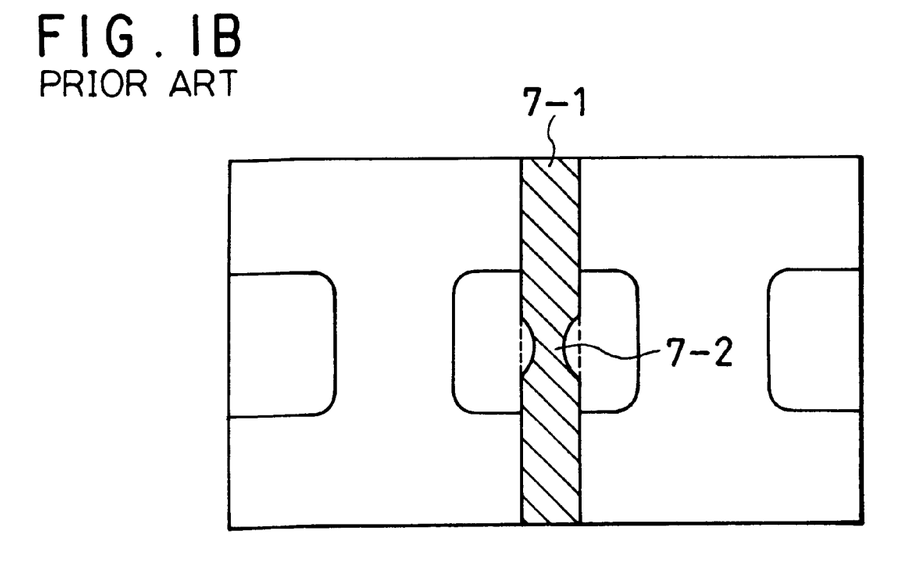
FIG. 1B a plan view of the semiconductor device illustrated in FIG. 1A having a photoresist mask formed thereon.

FIGS. 1A and 1B illustrate a conventional method of fabricating a resist mask to be used for formation of a gate electrode. As illustrated in FIG. 1A, there are formed a plurality of oxides 3 on a surface of a substrate 1 for isolating device formation regions from one another. A gate polysilicon film 5 is formed over the substrate 1, and a gate silicide film 6 is formed over the gate polysilicon film 5. The gate silicide film 6 is covered with photoresist 7. Both the gate polysilicon film 5 and gate silicide 6 have irregularities on surfaces thereof which reflect raises of the oxides 3.

When a resist mask to be used for formation of a gate electrode is to be formed on the gate silicide film 6, incident lights L reflected by corners of raised portions of the gate silicide film 6 are directed to a light-impermeable mask 18. As a result, after the photoresist 7 is etched for removal, a residual resist 7-1 has a portion 7-2 narrower than a width of the mask 18 above a device formation region, as illustrated in FIG. 1B.

An attempt to solve the above mentioned problem has been proposed in U.S. Pat. No. 5,346,587 issued on Sep. 13, 1994 to Doan et al. FIGS. 2A to 2D are cross-sectional views showing respective step of a method proposed by Doan et al.

Figure 2A:
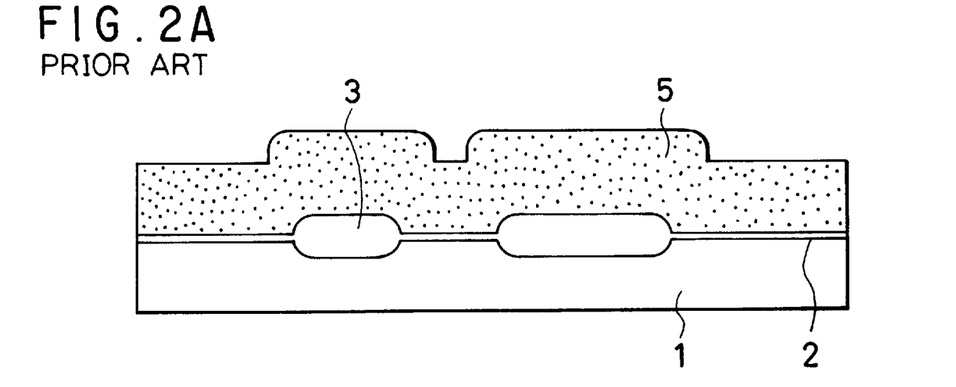
FIGS. 2A to 2C are cross-sectional views of a semiconductor device, showing respective step of a conventional method of fabricating the semiconductor device.

As illustrated in FIG. 2A, there are formed oxide films 3 for isolation of device formation regions and gate oxide films 2 on a substrate 1 in a conventional way. Then, a thick gate polysilicon film 5 is formed on the substrate 1 usually by low pressure chemical vapor deposition (LPCVD). Since polysilicon has superior coverage characteristic, the gate polysilicon film 5 has a top surface reflecting a shape of raised portions of the oxide films 3.

Figure 2B:
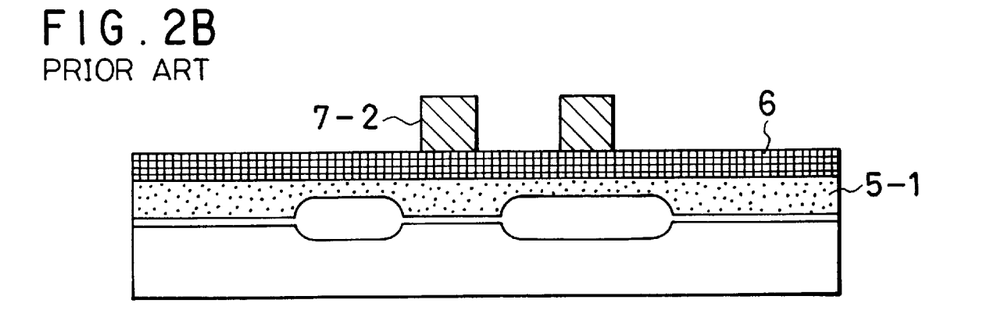

Then, as illustrated in FIG. 2B, the gate polysilicon film 5 is planarized. A gate silicide film 6 made of tungsten silicide is formed on the planarized gate polysilicon film 5-1. The gate silicide film 6 has a flat top surface which reflects a flat surface of the underlying polysilicon film 5-1. Then, photoresist is deposited over the gate silicide film 6, and thereafter the photoresist is patterned into photoresist 7-2 by means of KrF excimer laser beam to form a pattern of a gate electrode 8.

The KrF excimer laser beam reflects at a surface of the gate silicide film 6. However, since the gate silicide film 6 has a flat surface, there does not occur irregular reflection unlike the conventional method as illustrated in FIG. 1A. Accordingly, the patterned photoresist 7-2 can have exactly the same shape as a mask.

Figure 2C:
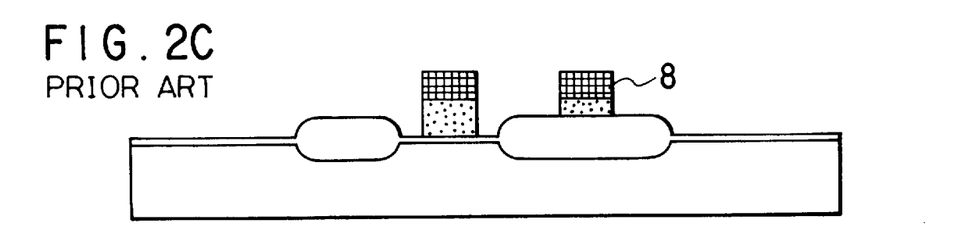

Then, both the gate silicide film 6 and the gate polysilicon film 5-1 are etched by using the photoresist 7-2 as a mask in a conventional way to thereby form the gate electrode 8, as illustrated in FIG. 2C.

Figure 2D:
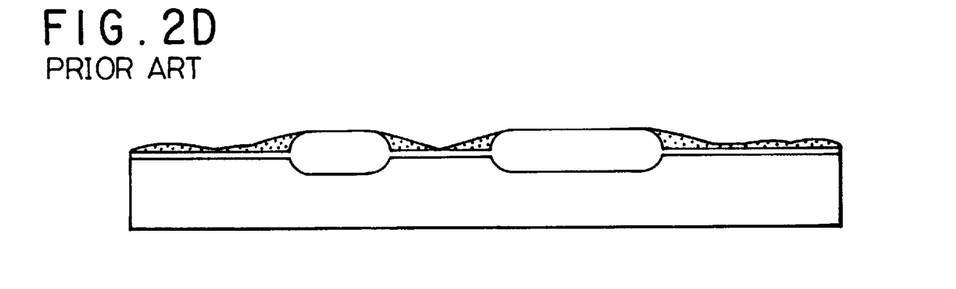
FIG. 2D is a cross-sectional view of a semiconductor device having irregularly etched polysilicon.

The above mentioned method of U.S. Pat. No. 5,346,587 has a problem as follows. In this method, when the gate polysilicon film 5 is to be planarized, the amount that the gate polysilicon film 5 is to be etched is empirically time-controlled. However, it is very difficult or almost impossible to observe a thickness of the gate polysilicon film 5 while the polysilicon film 5 is being etched. Thus, there is always a risk of over-etching of the gate polysilicon film 5. If the gate polysilicon film 5 is over-etched, as illustrated in FIG. 2D, the gate oxide films 2 and/or the substrate 1 may be exposed.

If the gate silicide film 6 makes direct contact with an exposed surface of the gate oxide films 2, a threshold voltage of a transistor is forced to vary due to a difference in work function between the gate silicide film 6 and the substrate 1.

In addition, in the process of formation of a gate electrode, if the gate polysilicon film 5 is thin, the gate oxide film 2 may be etched while the gate silicide film 6 lying on the thin gate polysilicon film 5 is being etched. If the gate oxide film 2 is etched, even the substrate 1 might be etched.

Thus, those skilled in the art could adopt a method of forming a mark for detecting an end point of etching in order to prevent over-etching of the gate polysilicon film 5. However, forming such a mark in additional steps would unpreferably increase the number of fabrication steps.

SUMMARY OF THE INVENTION

In view of the above mentioned problems in conventional semiconductor device and method of fabricating the same, it is an object of the present invention to provide a semiconductor device and a method of fabricating the same which are capable of providing a gate electrode having the same shape as a mask without significantly increasing the number of fabrication steps.

In one aspect, the present invention provides a semiconductor device including a substrate, first oxides formed on a surface of the substrate for isolating device formation regions from one another, at least one second oxide formed on a surface of the substrate, the second oxide having a top surface higher by a height H than top surfaces of the first oxides, gate oxide films formed on a surface of the substrate between the oxides, and at least one gate electrode formed on at least one of the first oxides and the gate oxide films, the gate electrode comprising a polysilicon film and a silicide film deposited on the polysilicon film. In this semiconductor device, the polysilicon film is planarized at a level higher than a top surface of the first oxides but lower than a top surface of the second oxide.

For instance, the height H is in the range from 500 angstroms to 1500 angstroms both inclusive.

In another aspect, the present invention provides a method of fabricating a semiconductor device, including the steps of (a) forming first and second regions on a surface of a substrate, the second regions having a top surface higher than top surfaces of the first regions, (b) forming oxides in selected regions both in the first and second regions for isolating device formation regions from one another so that oxides formed in the second regions have a top surface higher by a height H than top surfaces of oxides formed in the first regions, (c) forming gate oxide films on a surface of the substrate between the oxides, (d) forming a polysilicon film over the substrate, (e) planarizing the polysilicon film until top surfaces of the oxides formed in the second regions appear, and (f) depositing a silicide film on the planarized polysilicon film.

The first regions may be formed in various ways. For instance, the first regions can be formed by selective oxidation of the substrate, or by etching the substrate. When the first regions are formed by etching, an etching depth in the substrate is preferably in the range from 500 angstroms to 1500 angstroms both inclusive. It is preferable that the oxides in the first and second regions are formed concurrently with each other.

The present invention further provides a method of fabricating a semiconductor device, including the steps of (a) forming an oxide film, a polysilicon film and a silicon nitride film on a substrate on this order, (b) etching the silicon nitride film for removal in selected regions, (c) etching the polysilicon film and oxide film in a first region of the substrate, the polysilicon film and oxide film being left unetched in a second region of the substrate, (d) etching the substrate with residual silicon nitride films acting as a mask, (e) oxidizing both residual polysilicon films and the substrate so that oxides formed in the second region have top surfaces higher by a height H than top surfaces of oxides formed in the first region, (f) forming gate oxide films on a surface of the substrate between the oxides, (g) forming a polysilicon film over the substrate, (h) planarizing the polysilicon film until top surfaces of the oxides formed in the second region appear, and (i) depositing a silicide film on the planarized polysilicon film.

The etching depth in the step (d) is preferably in the range from 200 angstroms to 800 angstroms both inclusive.

In the present invention, the second oxides and the oxides formed in the second regions have top surfaces higher than top surfaces of the first oxides and the oxides formed in the first regions, and accordingly it is possible to use the second oxides and the oxides formed in the second regions as a mark for detecting an end point of etching to be carried out for planarization of the polysilicon film. Thus, it is possible to prevent over-etching of a polysilicon film formed in device formation regions.

The formation of the second oxides and the oxides in the second regions is accomplished concurrently with the formation of oxide films to be used for isolating device isolation regions from one another. Thus, it is not necessary to add steps for forming the second oxides and the oxides in the second regions, thereby not increasing the number of total fabrication steps.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

First Embodiment

Figure 3A:
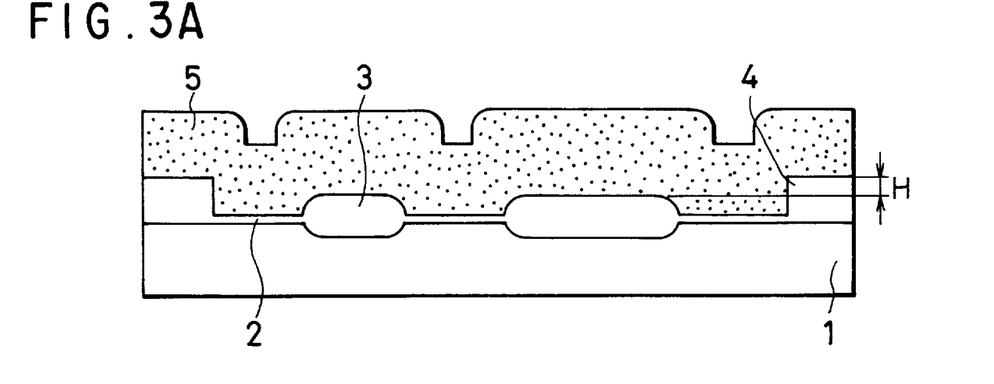
FIGS. 3A to 3D are cross-sectional view of a semiconductor device to be fabricated in accordance with the first embodiment of the present invention.

With reference to FIG. 3A, on a surface of the substrate 1, there are formed a plurality of first oxide films 3, two second oxide films 4 between which the plurality of the first oxide films 3 are located, and gate oxide films 2 between the first and second films 3 and 4. The first oxide films 3 are formed for the purpose of isolating device formation regions from one another. The second oxide films 4 are formed as a mark for detecting an end point of etching a polysilicon film, as mentioned later.

The second oxide films 4 are characterized by having top surfaces higher than top surfaces of the first oxide films 3 by a height H. The height H is preferably in the range from 500 angstroms to 1500 angstroms both inclusive. A thick gate polysilicon film 5 is formed over the first and second oxide films 3, 4 and the gate oxide films 2 by low pressure chemical vapor deposition (LPCVD). Since polysilicon has superior coverage characteristic, the gate polysilicon film 5 has an irregular top surface reflecting a shape of raised portions of the first and second oxide films 3 and 4.

Figure 3B:
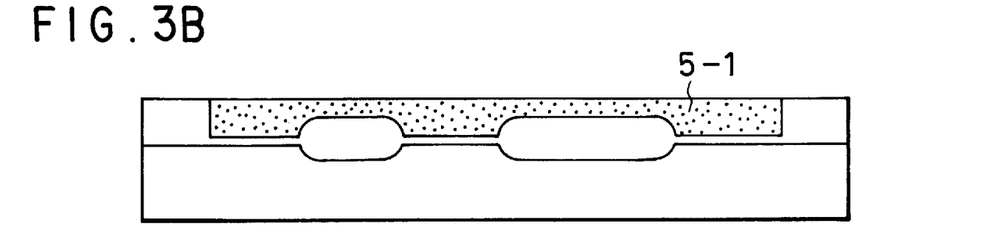

Then, as illustrated in FIG. 3B, the gate polysilicon film 5 is planarized. The planarization of the gate polysilicon film 5 is accomplished, for example, by isotropic etching or chemical and mechanical polishing (CMP). The gate polysilicon film 5 is planarized until top surfaces of the second oxide films 4 appear. When isotropic dry etching is to be used for planarization of the gate polysilicon film 5, when the etching should be finished can be determined by detecting a variation in plasma emission caused by exposure of the second oxide films 4. When CMP is to be used, when CMP should be finished can be determined by detecting a variation in a friction coefficient caused by exposure of the second oxide films 4.

Since the second oxide films 4 have top surfaces higher than top surfaces of the first oxide film 3, the second oxide films 4 can act as a mark for detecting an end point of etching the gate polysilicon film 5. Thus, it is possible to prevent over-etching of the gate polysilicon film 5.

Figure 3C:
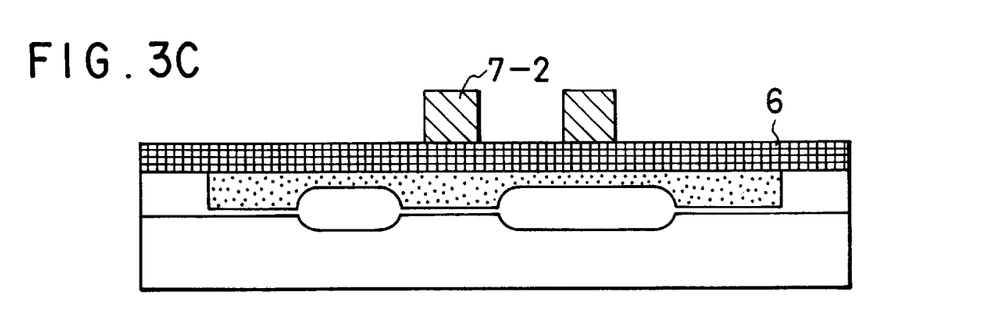

The gate silicide film 6 has a flat top surface reflecting a flat surface of the underlying polysilicon film 5-1. Then, as illustrated in FIG. 3C, a gate silicide film 6 made of tungsten silicide is deposited on the planarized gate polysilicon film 5-1. Then, a photoresist is deposited over the gate silicide film 6, and etched into gate patterns 7-2 by means of KrF excimer laser beam.

The KrF excimer laser beam reflects at a top surface of the gate silicide film 6. Since the top surface of the gate silicide film 6 is flat, there never occurs irregular reflection unlike the conventional gate silicide film as illustrated in FIG. 1A. Thus, it is possible to form the photoresist masks 7-2 having the same shape and dimensions as those of an original light-impermeable mask.

Figure 3D:
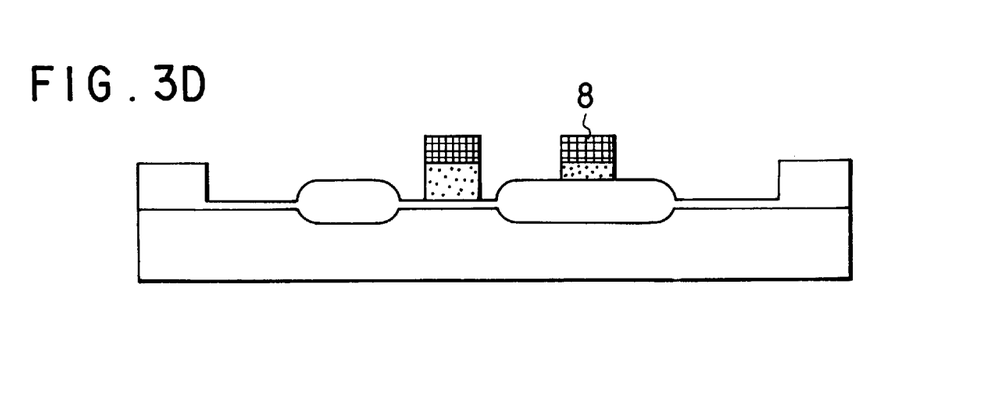

Then, as illustrated in FIG. 3D, the gate silicide film 6 and the gate polysilicon film 5 are etched in a conventional way to thereby form gate electrodes 8.

As mentioned earlier, it is not preferable to form the second oxide films 4 in separate steps, because the number of total fabrication steps significantly increases.

Methods of forming the second oxide films 4 acting as a mark for detecting an end point of etching are described hereinafter in the second and third embodiments.

Second Embodiment

Hereinbelow is described a method of forming the oxide films 4 with reference to FIGS. 4A to 4H. In this embodiment, a first region of the substrate is recessed to thereby make the oxide films to be formed in a second region to have top surfaces higher than top surfaces of the oxide films to be formed in the first region. Similarly to the first embodiment, the oxide films formed in the second region can act as a mark for detecting an end point of etching the gate polysilicon film.

Figure 4A:
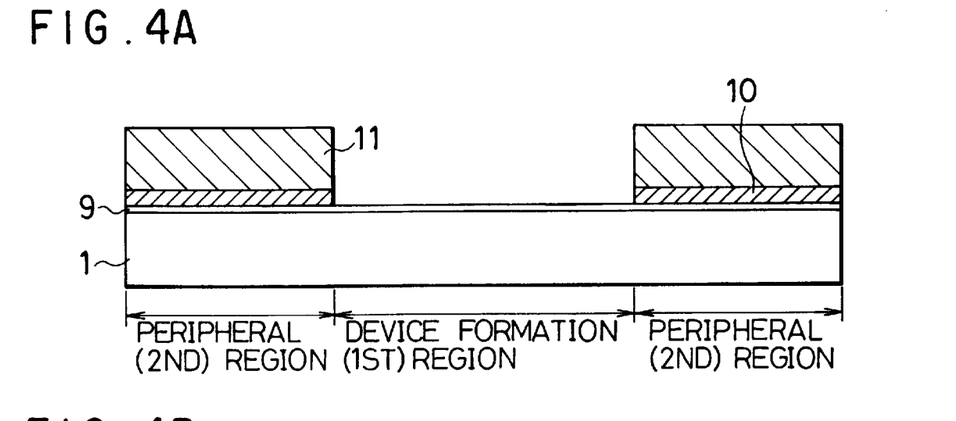
FIGS. 4A to 4H are cross-sectional view of a semiconductor device to be fabricated in accordance with the second embodiment of the present invention.
Figure 4B:
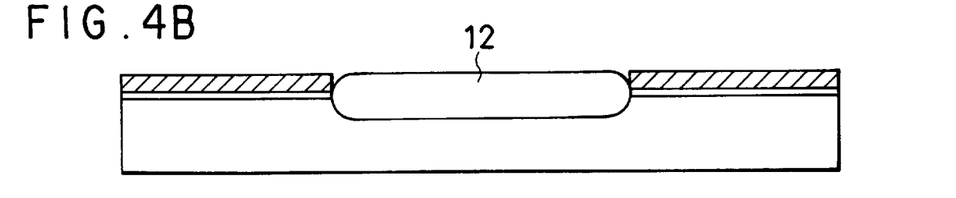

First, a pad oxide film 9, a silicon nitride film 10 and photoresist 11 are deposited on a substrate 1. After patterning the photoresist 11, the silicon nitride film 10 is etched in a device formation region as a first region. Then, as illustrated in FIG. 4B, the substrate 1 is oxidized. Since the silicon nitride film 10 remains as it is in peripheral regions or second regions, the substrate 1 is oxidized only in the device formation region. As a result, an oxide film 12 is formed in the device formation region. Then, the silicon nitride film 10 and the oxide film 12 are all removed.

Thus, the substrate 1 has a recessed portion in the device formation region. In order not to significantly increase the number of fabrication steps, the removal of the silicon nitride film 10 in the device formation region is accomplished by means of lithography which is to be carried out also for ion implantation into the substrate 1.

In a memory device such as DRAM, only memory cells having narrow device isolation regions may be recessed.

In '88 VLSI Symposium Digest pp. 17–18, there is described a method of recessing memory cells in DRAM to thereby relax steps in storage node. In order to relax steps in the storage node, it is necessary to recess about 5000 angstroms.

In contrast, the purpose of the present invention is to merely planarize the gate polysilicon film, and thus a recessed depth, namely the height H is preferably in the range from 500 to 1500 angstroms, which range corresponds to a thickness of the gate polysilicon film.

In the embodiment, the device formation region is recessed by means of selective oxidation. However, it should be noted that the recessed region may be accomplished by directly etching the substrate 1 with the photoresist 11 acting as a mask.

Figure 4C:
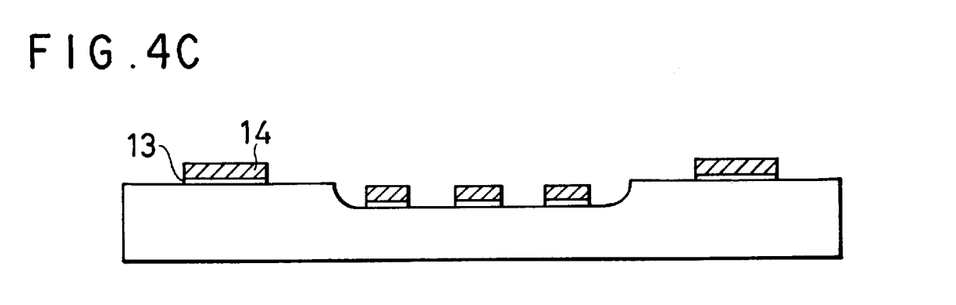
Figure 4D:
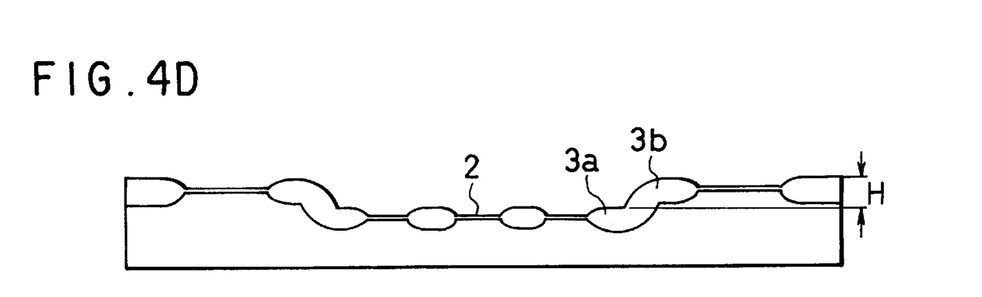

Then, as illustrated in FIG. 4C, an oxide film 13 and a silicon nitride film 14 are deposited on the substrate 1, and patterned into a desired pattern. Then, as illustrated in FIG. 4D, there are formed a plurality of oxide films 3 both in the device formation region and peripheral regions by a conventional selective oxidation process. The oxide films 3 are formed so that the oxide films 3b formed in the peripheral regions have a top surface higher by a height H than top surfaces of the oxide films 3a formed in the device formation regions. The height H corresponds to a thickness of a planarized gate polysilicon film, and is preferably in the range from 500 to 1500 angstroms both inclusive. Gate oxide films 2 are also formed between the oxide films 3.

Figure 4E:
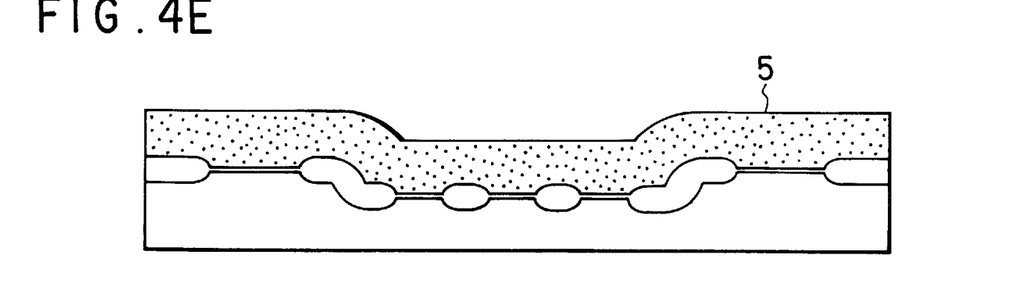
Figure 4F:
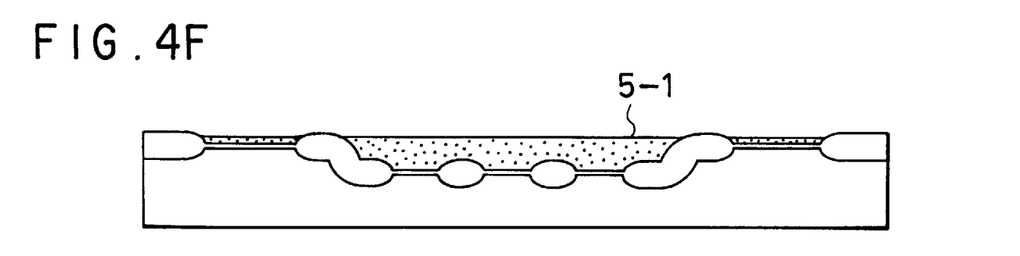

Then, as illustrated in FIG. 4E, a thick gate polysilicon film 5 is deposited over the gate oxide films 2 and oxide films 3. Then, as illustrated in FIG. 4F, the gate polysilicon film 5 is planarized until the top surfaces of the oxide films 3b formed in the peripheral regions appear.

Figure 4G:
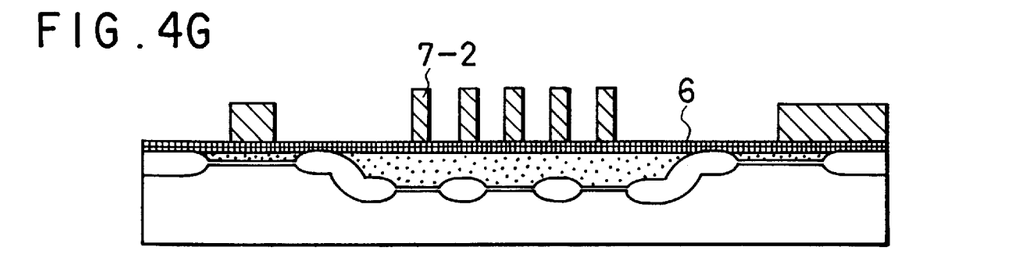

Then, as illustrated in FIG. 4G, a gate silicide film 6 is deposited over the planarized gate polysilicon film 5-1. Then, the gate silicide film 6 is covered with a photoresist, which in turn is patterned into gate electrode patterns 7-2. Then, the gate silicide film 6 and the gate polysilicon film 5 are etched in a conventional way to thereby form gate electrodes 8.

Figure 4H:
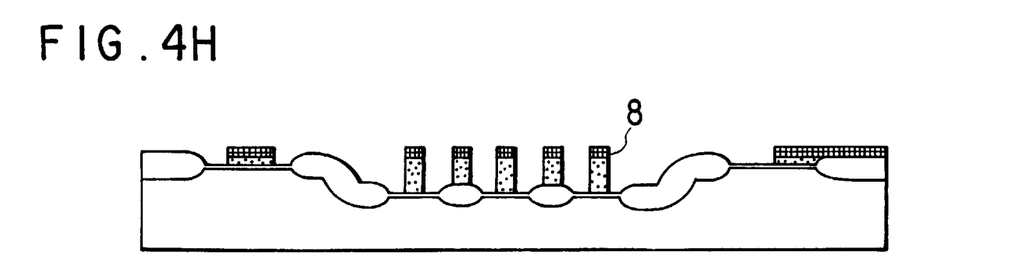

When only memory cells are to be recessed in DRAM, top surfaces of the oxide films are in exposure in the peripheral regions. Thus, the gate electrodes 8 of devices in the peripheral regions are electrically connected to one another only through the gate silicide film 6.

In accordance with the second embodiment, since the gate silicide film 6 has a flat surface, there never occurs irregular reflection of excimer laser beam in the formation of the gate electrodes 8. Hence, it is possible to form the photoresist mask having exactly the same shape as a light-impermeable mask.

In addition, it is not necessary to form the oxide films 3b, which acts as a mark for detecting an end point of etching the gate polysilicon film 5, in separate steps, because the oxide films 3b are formed together with the oxide films 3a acting as an insulator of device formation regions.

Furthermore, the lithography for etching the device formation region may be common to the lithography for forming p- and/or n-type wells. Thus, the number of fabrication steps is not be increased.

Third Embodiment

In the third embodiment, there is adopted another method of forming the oxide films for isolating device formation regions from one another to thereby cause the oxide films formed in the second or peripheral regions to have a top surface higher than top surfaces of the oxide films formed in the first or device formation regions. Similarly to the first and second embodiments, the oxide films formed in the second or peripheral regions act as a mark for detecting an end point of etching the gate polysilicon film.

Figure 5A:
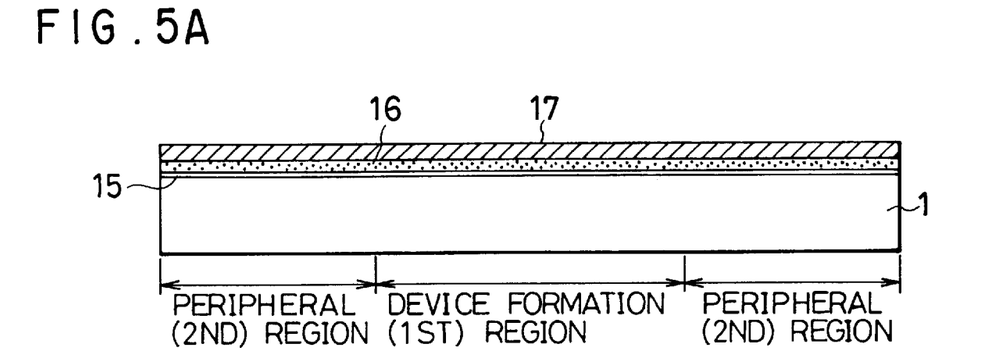
FIGS. 5A to 5H are cross-sectional view of a semiconductor device to be fabricated in accordance with the third embodiment of the present invention.

As illustrated in FIG. 5A, an oxide film 15, a polysilicon film 16 and a silicon nitride film 17 are deposited on a substrate in this order. The oxide film 15 has a thickness in the range from 50 to 300 angstroms, the polysilicon film 16 has a thickness in the range from 500 to 1000 angstroms, and the silicon nitride film 17 has a thickness in the range from 1500 to 2500 angstroms.

Figure 5B:
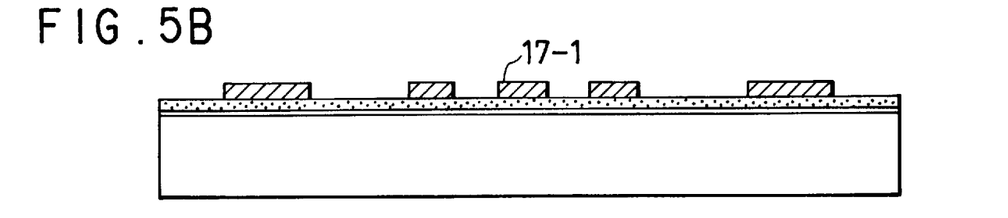

Then, as illustrated in FIG. 5B, the silicon nitride film 17 is etched so that silicon nitride films 17-1 remain unetched only in regions where devices are to be formed. Then, a photoresist 11 is formed only on the second or peripheral regions.

Figure 5C:
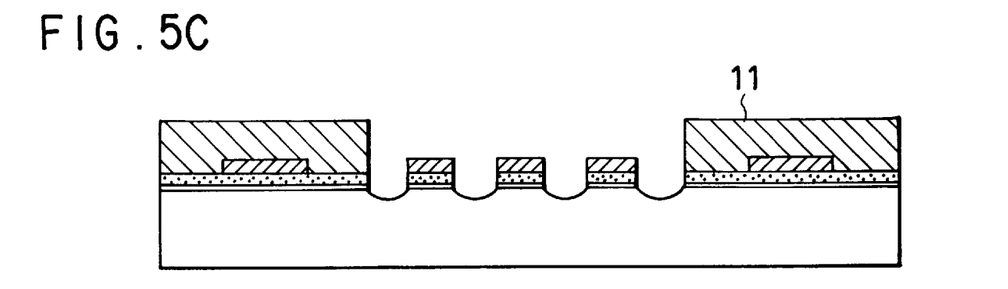

Then, as illustrated in FIG. 5C, the polysilicon film 16 and the oxide film 15 are etched only in the first or device formation regions by using the photoresist 11 and silicon nitride films 17-1 as a mask. Then, the substrate 1 is etched by using multi-layered structures 15, 16 and 17-1 as a mask. The substrate 1 is etched by a depth ranging from 200 to 800 angstroms.

Figure 5D:
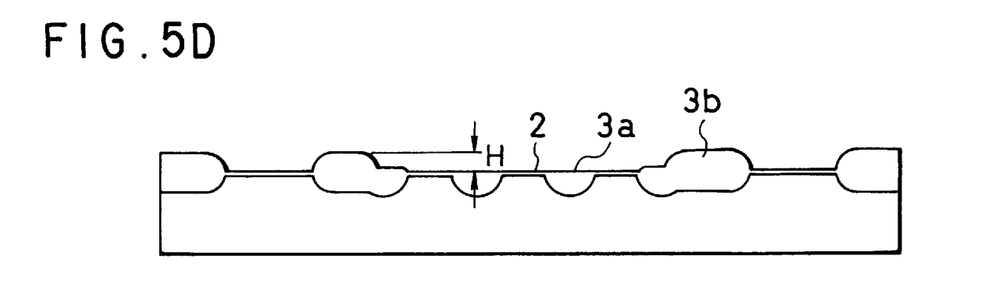

Then, the photoresist 11 is removed. Then, the substrate 1 is oxidized to thereby form oxide films 3 both in the device formation region and peripheral regions. In the device formation region, the oxidation starts from the substrate 1, whereas in the peripheral regions where the polysilicon film 16 still remains, the oxidation starts from the polysilicon film 16. Thus, the oxide films 3 formed in the device formation region and peripheral region have top surfaces having different height. Specifically, the oxide films 3b formed in the peripheral regions have top surfaces higher by a height H than top surfaces of the oxide films 3a formed in the device formation region.

The difference height H can be varied by an etching depth of the substrate 1, a thickness of the polysilicon film 16 or oxidation condition. In the third embodiment, the height H is set in the range from 500 to 1500 angstroms both inclusive. This range corresponds to a thickness of a gate polysilicon film which will be later deposited over the oxide films 3.

Figure 5E:
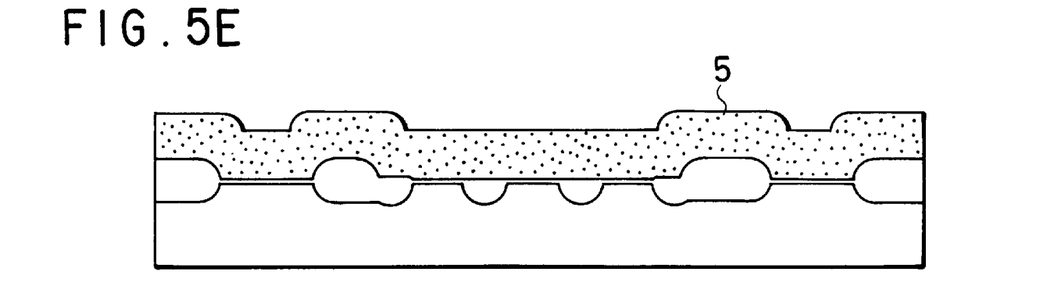
Figure 5F:
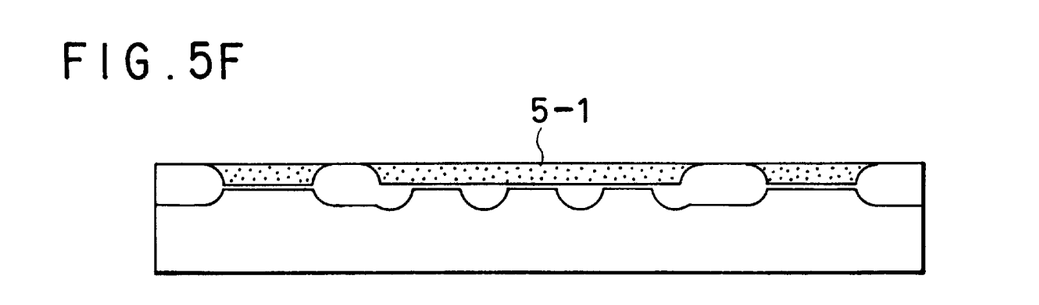

Then, gate oxide films 2 are formed between the oxide films 3. Then, as illustrated in FIG. 5E, a thick gate polysilicon film 5 is deposited over the substrate 1. Thereafter, the gate polysilicon film 5 is planarized until top surfaces of the oxide films 3b formed in the peripheral regions appear, as illustrated in FIG. 5F.

Figure 5G:
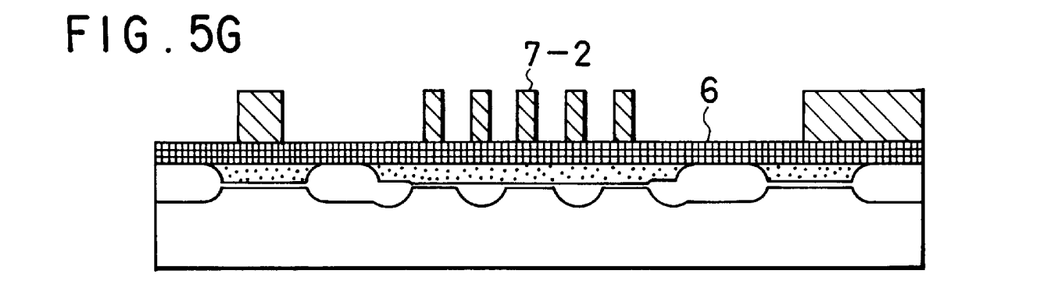
Figure 5H:
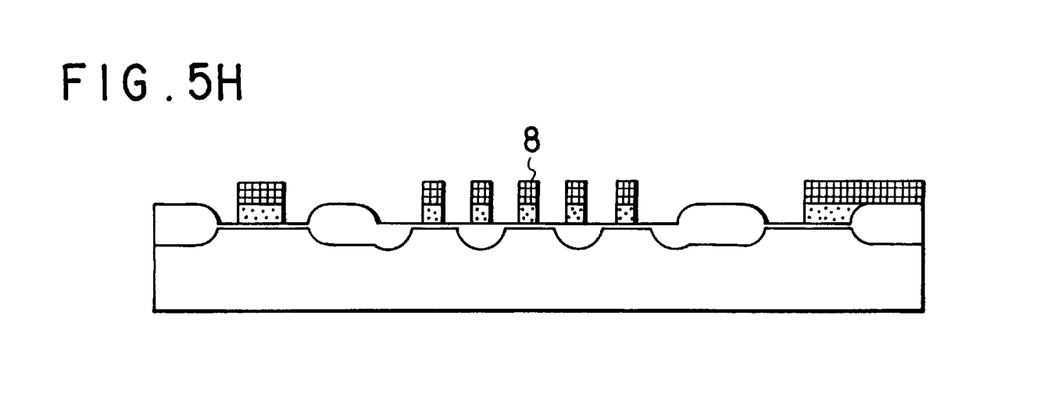

Then, similarly to the second embodiment, a gate silicide film 6 is deposited over the planarized gate polysilicon film 5-1, as illustrated in FIG. 5G. Then, the gate silicide film 6 is covered with a photoresist, which in turn is patterned into gate electrode patterns 7-2. Then, the gate silicide film 6 and the gate polysilicon film 5-1 are etched in a conventional way to thereby form gate electrodes 8, as illustrated in FIG. 5H.

In the above mentioned third embodiment, similarly to the second embodiment, it is not necessary to form the oxide films 3b, which acts as a mark for detecting an end point of etching the gate polysilicon film 5, in separate steps, because the oxide films 3b are formed together with the oxide films 3a acting as an insulator of device formation regions. In addition, the lithography for etching the polysilicon film 16, the oxide film 15 and the substrate 1 in the device formation region may be common to the lithography for forming p- and/or n-type wells. Thus, the number of fabrication steps is not be increased.

The oxide films 3a formed on the etched substrate 1 have a flat surface, which makes easier to form the gate electrodes 8.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device, comprising the steps of:
    (a) forming first and second regions on a surface of a substrate, said second regions having a top surface higher than top surfaces of said first regions;
    (b) forming oxides in selected regions both in said first and second regions for isolating device formation regions from one another so that oxides formed in said second regions have a top surface higher by a height H than top surfaces of oxides formed in said first regions;
    (c) forming gate oxide films on a surface of said substrate between said oxides;
    (d) forming a polysilicon film over said substrate;
    (e) planarizing said polysilicon film until top surfaces of said oxides formed in said second regions appear; and
    (f) depositing a silicide film on said planarized polysilicon film.

2. The method as set forth in claim 1, wherein said height H is at least 500 angstroms, but below 1500 angstroms.

3. The method as set forth in claim 1, wherein said first regions are formed by etching in said substrate.

4. The method as set forth in claim 3, wherein said substrate is recessed by a depth between 500 angstroms and 1500 angstroms.

5. The method as set forth in claim 1, wherein said first regions are formed by selective oxidation of said substrate.

6. The method as set forth in claim 1, wherein said oxides in said first and second regions are formed concurrently with each other.

7. A method of fabricating a semiconductor device, comprising the steps of:
    (a) forming an oxide film, a polysilicon film and a silicon nitride film on a substrate on this order;
    (b) etching said silicon nitride film for removal in selected regions;
    (c) etching said polysilicon film and oxide film in a first region of said substrate, said polysilicon film and oxide film being left unetched in a second region of said substrate;
    (d) etching said substrate with residual silicon nitride films acting as a mask;
    (e) oxidizing both residual polysilicon films and said substrate so that oxides formed in said second region have top surfaces higher by a height H than top surfaces of oxides formed in said first region;
    (f) forming gate oxide films on a surface of said substrate between said oxides;
    (g) forming a polysilicon film over said substrate;
    (h) planarizing said polysilicon film until top surfaces of said oxides formed in said second region appear; and
    (i) depositing a silicide film on said planarized polysilicon film.

8. The method as set forth in claim 7, wherein said substrate is etched by a depth ranging from 200 angstroms to 800 angstroms in said step (d).

9. The method as set forth in claim 7, wherein said height H in said step (e) is in the range from 500 angstroms to 1500 angstroms both inclusive.

10. A method of fabricating a semiconductor device, comprising the steps of:
    (a) forming an isolating insulator having a first height on a first region of a semiconductor substrate;
    (b) forming an end point detecting film on a second region of said semiconductor substrate, said end point detecting film having a second height higher than said first height;
    (c) forming a layer on said semiconductor substrate, said isolating insulator, and said end point detecting film;
    (d) planarizing said layer;
    (e) detecting a surface of said end point detecting film; and
    (f) stopping said step (d) in response to detection of said surface of said end point detecting film.

11. The method as set forth in claim 10, wherein said step (d) is performed by CMP.

12. The method as set forth in claim 11, wherein said step (e) is performed by observing a friction rate of said CMP.

13. The method as set forth in claim 10, wherein said step (d) is performed by a dry etching process.

14. The method as set forth in claim 13, wherein said step (e) is performed by observing plasma radiation of said dry etching process.

* * * * *